United States Patent
Horng et al.

(10) Patent No.: US 10,181,470 B1
(45) Date of Patent: Jan. 15, 2019

(54) MIXED P/N MOS ARRAY LAYOUT AND METHODS OF FORMING THE SAME

(71) Applicant: Taiwan Semiconductor Manufacturing Company Limited, Hsinchu (TW)

(72) Inventors: Jaw-Juinn Horng, Hsinchu (TW); Bei-Shing Lien, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/638,505

(22) Filed: Jun. 30, 2017

(51) Int. Cl.
*H01L 27/092* (2006.01)
*H01L 21/8238* (2006.01)

(52) U.S. Cl.
CPC .... *H01L 27/092* (2013.01); *H01L 21/823878* (2013.01)

(58) Field of Classification Search
CPC ...................... H01L 27/092; H01L 21/823878
USPC .......................................................... 257/369
See application file for complete search history.

(56) References Cited

U.S. PATENT DOCUMENTS

2016/0254261 A1* 9/2016 Machkaoutsan ...... H01L 21/321
257/369

* cited by examiner

*Primary Examiner* — Fernando L Toledo
*Assistant Examiner* — Adam S Bowen
(74) *Attorney, Agent, or Firm* — Jones Day

(57) ABSTRACT

A semiconductor structure is disclosed that includes a p-channel metal-oxide semiconductor (PMOS) array having a first set of oxide diffusion layer (OD) structures, an n-channel metal-oxide semiconductor (NMOS) array having a second set of OD structures, and a dummy buffer zone surrounding the PMOS and NMOS arrays. The semiconductor structure has a uniform spacing between OD structures in the first and second sets of OD structures and between the PMOS and NMOS array, such that no dummy buffer zone is included between the PMOS array and the NMOS array.

20 Claims, 17 Drawing Sheets

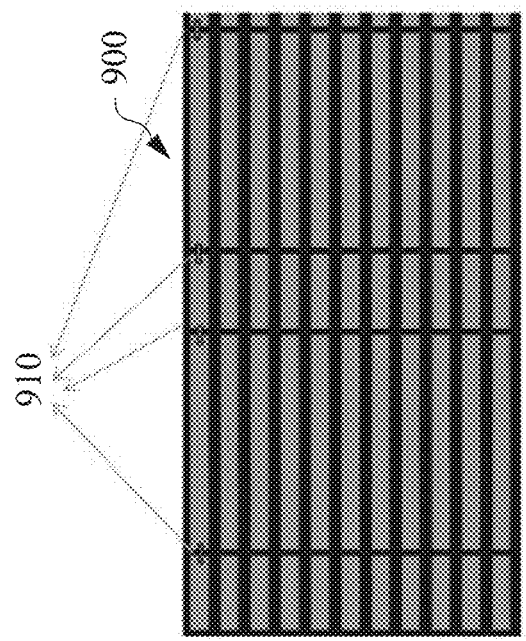
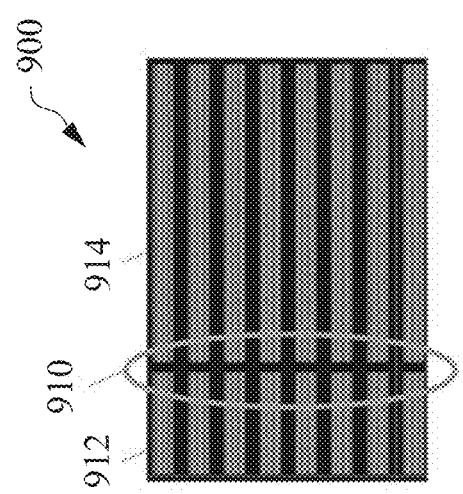
FIG. 9B
FIG. 9A

US 10,181,470 B1

MIXED P/N MOS ARRAY LAYOUT AND METHODS OF FORMING THE SAME

BACKGROUND

Integrated circuits are often formed in arrays wherein the same Metal-Oxide Semiconductor (MOS) device geometry is repeated multiple times across a reticle field. The performance of the integrated circuit is dependent upon pattern uniformity between the shapes that comprise functional components of the MOS devices within the array in order to ensure matching of their electrical characteristics. Pattern uniformity of the shapes at the edge of the array is sensitive to density of the background circuitry, because there is a density gradient between the edge of the array and the background circuitry. The existing solution is to add a buffer zone of dummy devices which are identical to the MOS device, but not electrically active. The buffer zone results in better pattern uniformity of the active MOS devices within the array, but can add significant area overhead to a chip.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6-12 illustrate an example layout for a digital-to-analog converter circuit utilizing a mixed P/N MOS array layout with a uniform gate/OD density, in accordance with some embodiments.

DETAILED DESCRIPTION

Figure 1:
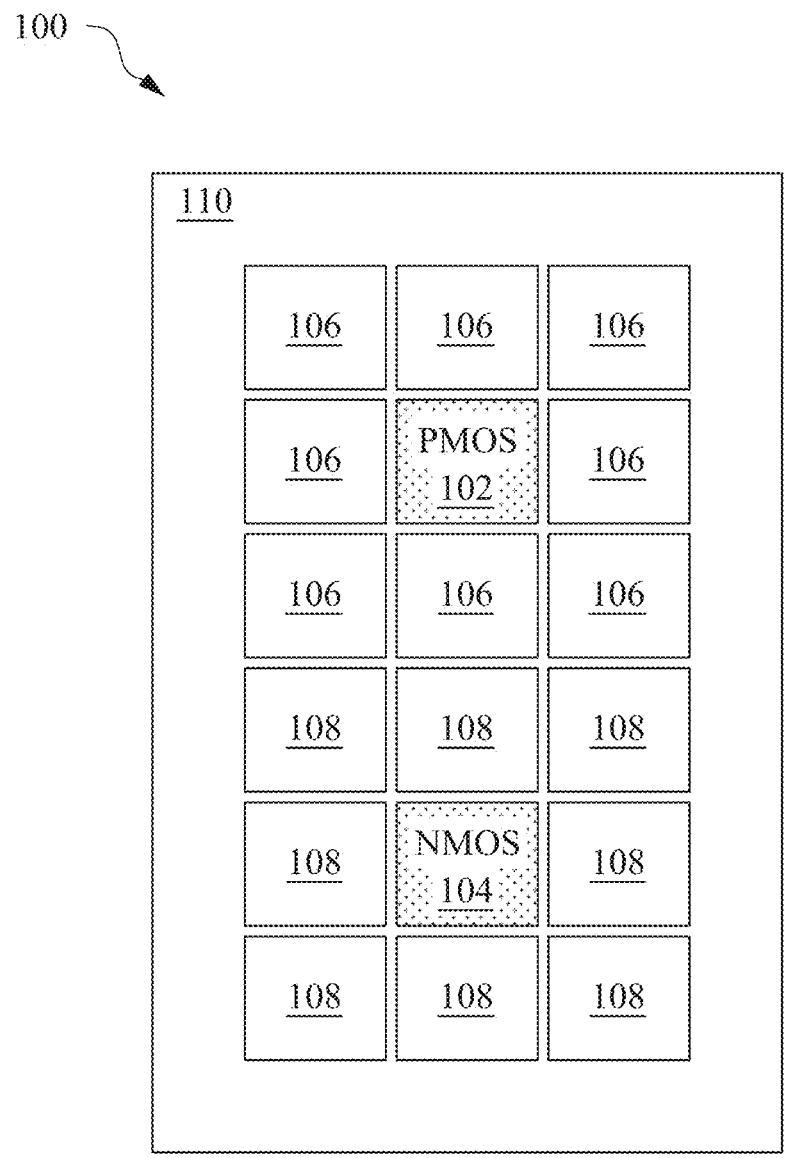
FIG. 1 illustrates a semiconductor device array, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 illustrates a semiconductor device array 100 that includes a PMOS array 102, an NMOS device array 104, and a plurality of dummy arrays 106, 108. The dummy arrays 106 surrounding the PMOS array 102 have physical layout topologies which are identical to those of the PMOS array 102, but are not electrically active. Similarly, the dummy arrays 108 surrounding the NMOS array 104 have physical layout topologies which are identical to those of the NMOS array 104, but are not electrically active. Together, the dummy arrays 106, 108 form a dummy buffer zone that separates the PMOS and NMOS arrays from one another and from a surrounding semiconductor region 110.

In advanced semiconductor processing techniques, such as 20 nm processing and smaller, a gradient in density of the silicon material commonly used as a gate contact for metal-oxide-semiconductor (MOS) devices formed within a semiconductor device array 100 and the surrounding semiconductor region 110 can affect circuit performance of the MOS devices resulting from a mismatch in analog device geometries and resulting electrical parameters (referred to as density gradient effect or DGE.) To reduce the analog device mismatch for the semiconductor device array 100, layout guidelines suggest that a designer surround each of the PMOS and NMOS arrays 102, 104 with dummy buffer arrays 106, 108 of the same MOS type. Layout guidelines further suggest that MOS arrays smaller than 40×40 $\mu m^2$ should include an extra 5 $\mu m$ of surrounding dummy buffer arrays, and MOS arrays larger than or equal to 40×40 $\mu m^2$ should include an extra 20 $\mu m$ of surrounding dummy buffer arrays. This creates area penalties greater than 1.56× for MOS arrays smaller than 40×40 $\mu m^2$ and area penalties between 2× and 4× for MOS arrays larger than or equal to 40×40 $\mu m^2$, as further illustrated by FIGS. 2A and 2B.

Figure 2A:
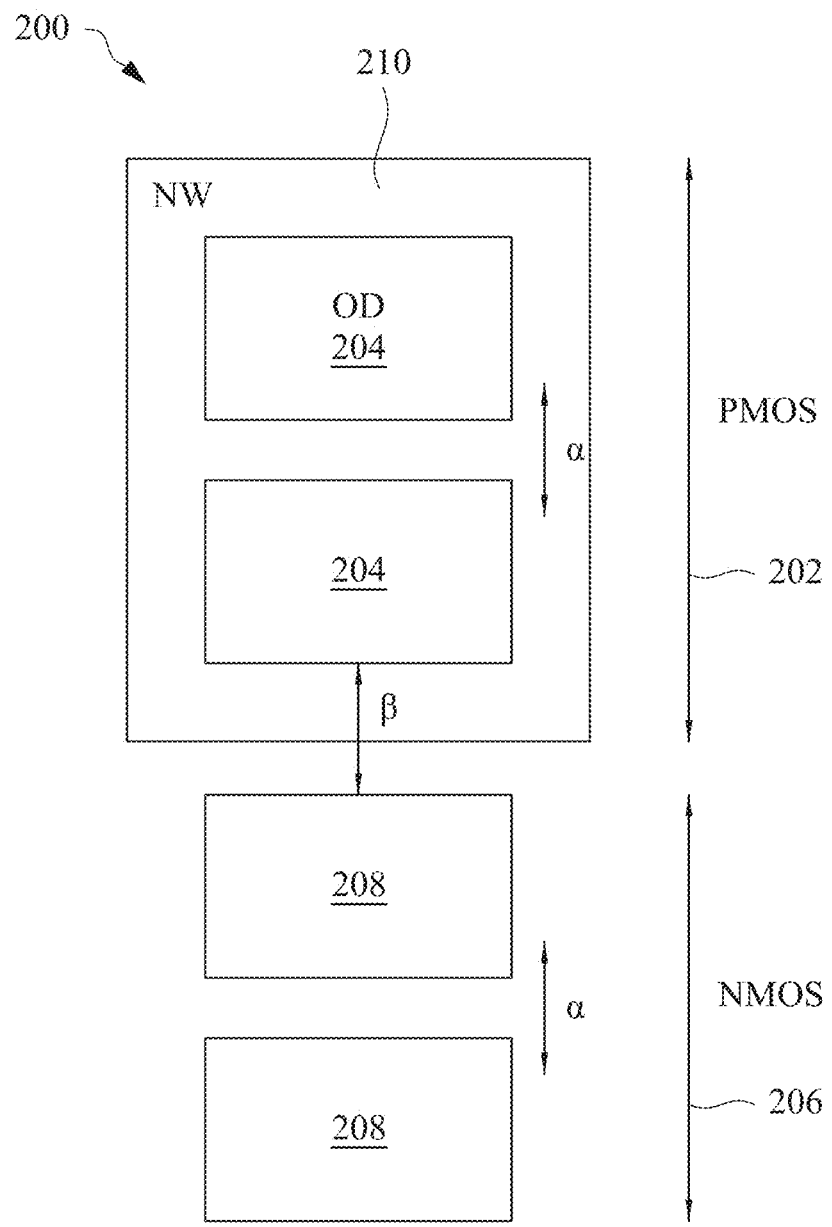
FIG. 2A-2C illustrate oxide diffusion (OD) layer spacing in a mixed P/N MOS array layout, in accordance with some embodiments.
Figure 2B:
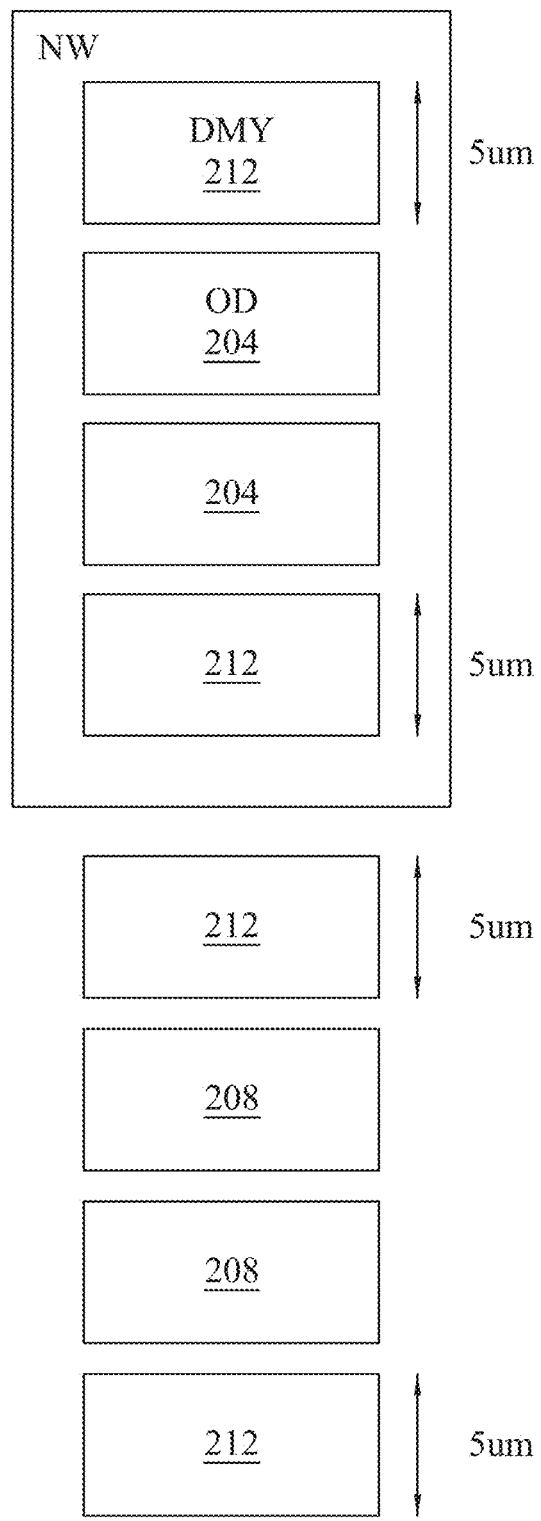

FIG. 2A illustrates an example of oxide diffusion (OD) layer spacing in a mixed P/N MOS array layout 200. The example layout 200 includes a PMOS array 202 with two OD structures 204 and an NMOS array 206 with two OD structures 208 (the silicon gate layer is not shown). Also illustrated is the N-well 210 of the PMOS array 202. Layout guidelines suggest that the designer provide at least a first minimum spacing ($\alpha$) between OD structures 204, 208 within each MOS array 202, 206, and a second minimum spacing ($\beta$) between the PMOS and NMOS arrays 202, 206. Because these layout guidelines result in a non-uniform OD spacing throughout the MOS array 200 (i.e., the spacing ($\beta$) between PMOS and NMOS arrays 202, 206 is not the same as the OD spacing ($\alpha$) within each array), layout guidelines further suggest the inclusion of 5 $\mu m$ identical dummy buffers 212 between different MOS types, as shown in FIG. 2B. The potentially significant area penalty caused by the inclusion of identical dummy buffers 212 between different MOS types is apparent by comparing the MOS array layouts in FIGS. 2A and 2B.

Figure 2C:
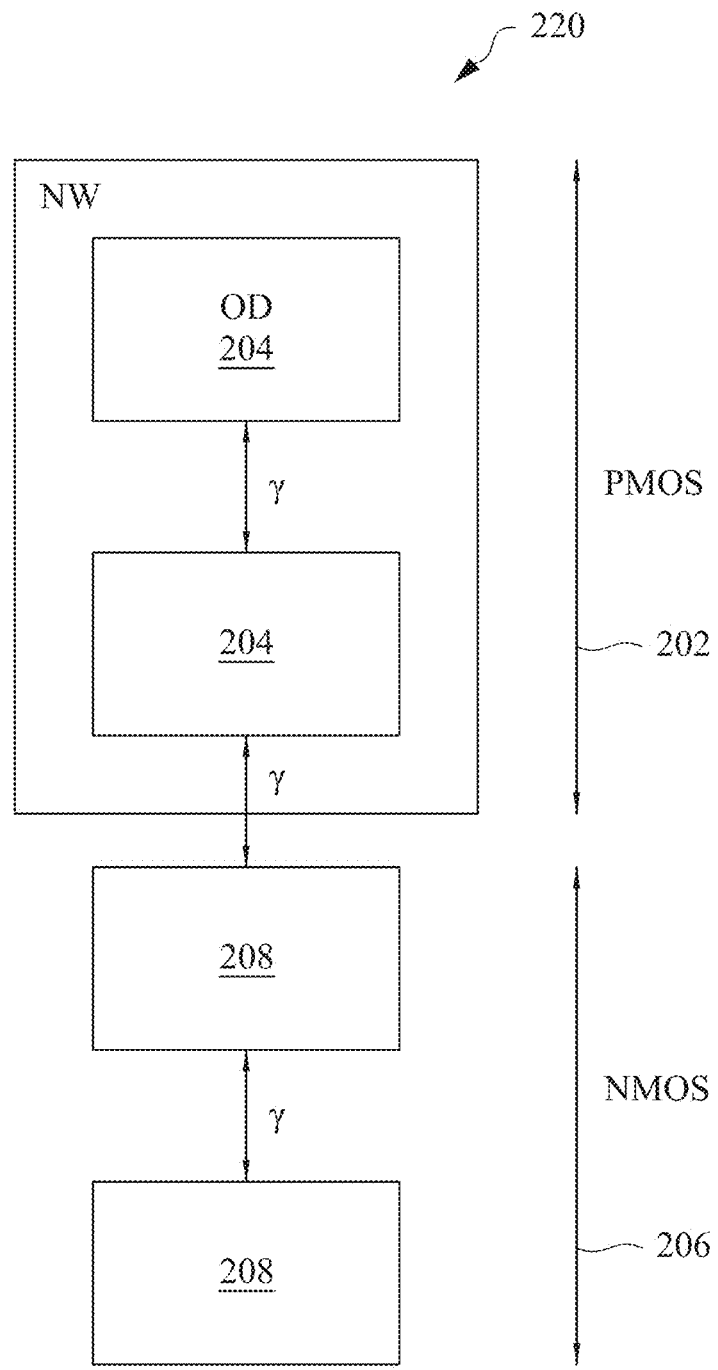

FIG. 2C illustrates another OD layout 220 for a mixed P/N MOS array that eliminates the need for identical dummy buffers between different MOS types. In this OD layout 220, a uniform OD spacing ($\gamma$) is used between all OD structures 204, 208 within the MOS array, including between PMOS and NMOS arrays 202, 206. Although the uniform OD spacing ($\gamma$) may be greater than the minimum spacings ($\alpha$ and/or $\beta$) suggested by the layout guidelines, the use of a uniform OD spacing ($\gamma$) both within and between the PMOS and NMOS arrays 202, 206 helps to provide a uniform OD density, which may eliminate the need for dummy buffers 212 between MOS types. As should be appreciated by comparing the layouts in FIGS. 2B and 2C, the elimination of dummy buffers between MOS types can result in a significant area reduction in a mixed P/N MOS array layout.

Figure 3:
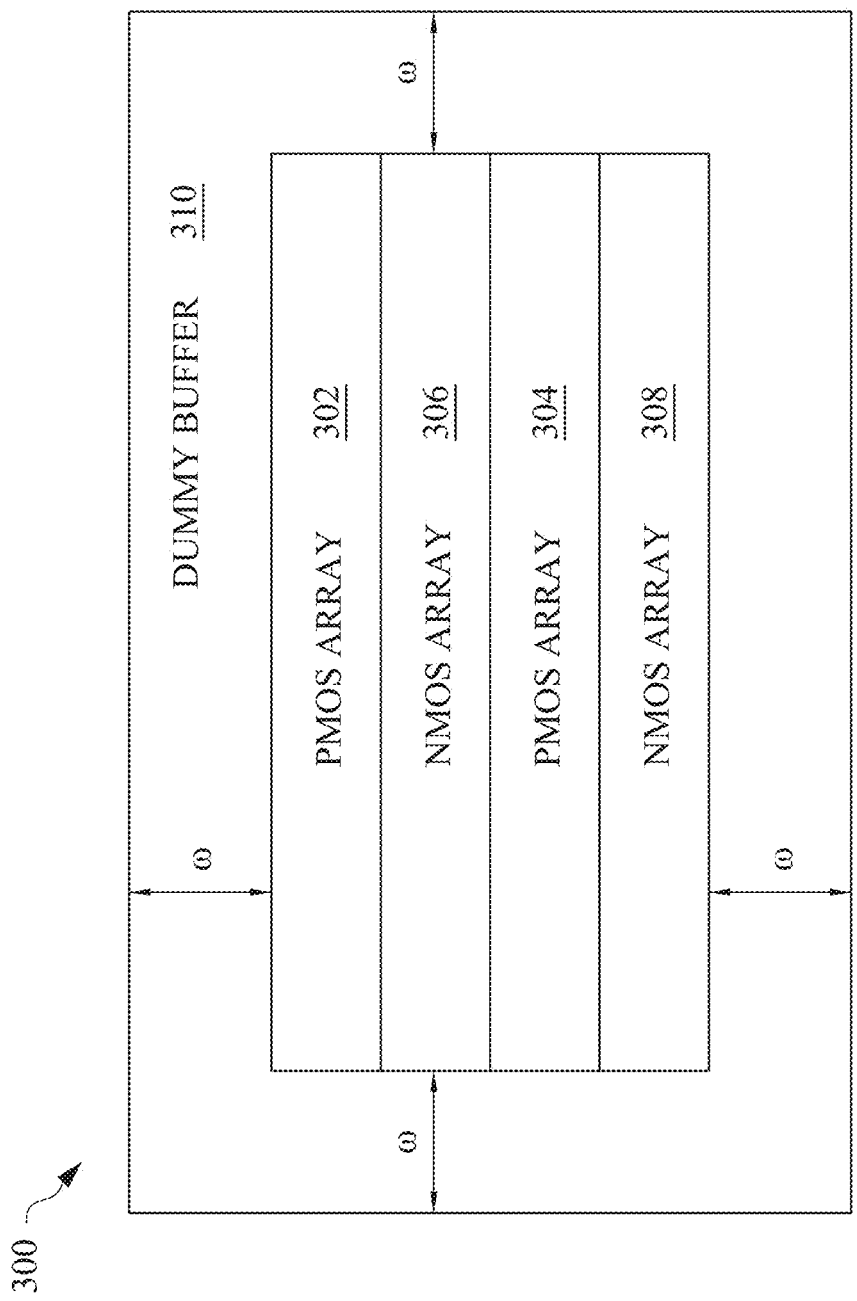
FIG. 3 illustrates a mixed P/N MOS array layout with a uniform gate/OD density, in accordance with some embodiments.

FIG. 3 illustrates an example of a mixed P/N MOS array layout 300 with a uniform gate/OD density. The illustrated mixed P/N MOS array layout 300 includes two PMOS arrays 302, 304, two NMOS arrays 306, 308, and a surrounding dummy buffer zone 310. As a consequence of a uniform gate/OD density throughout, the mixed P/N MOS array layout 300 does not require dummy buffers between PMOS and NMOS arrays 302, 304, 306, 308. A uniform OD density is provided within the mixed P/N MOS array layout 300 by providing a uniform OD spacing ($\gamma$) both within and between the PMOS and NMOS arrays 302, 304, 306, 308, as described above with reference to FIG. 2C, and also by providing a unified OD size (MOS width) for all devices within the layout 300. A uniform gate density is provided within the mixed P/N MOS array layout 300 by utilizing a design having a uniform length and distribution, i.e., pitch, of the silicon gate structures (see, e.g., FIG. 8 described below.)

The dummy buffer zone 310 in the illustrated layout 300 has a uniform width ($\omega$) on all sides of the mixed P/N MOS array. As explained above, layout guidelines suggest that the buffer zone 310 width ($\omega$) should be 5 µm if the mixed P/N MOS array is smaller than 40×40 µm$^2$, and should be 20 µm if the mixed P/N MOS array is larger than or equal to 40×40 µm$^2$.

Figure 4A:
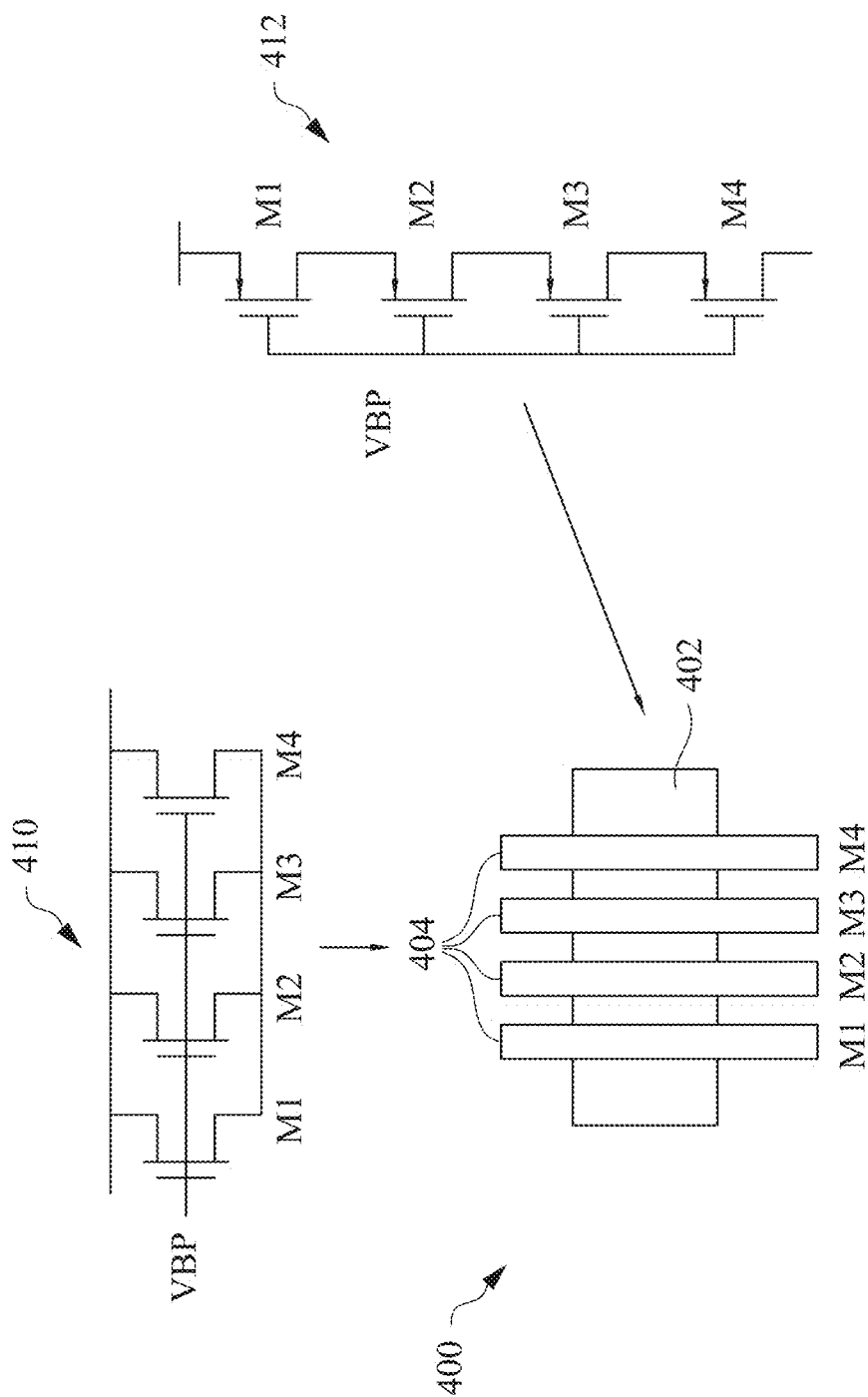
FIGS. 4A and 4B illustrate horizontal and vertical stress caused by a density gradient effect (DGE) in a MOS edge during device fabrication, in accordance with some embodiments.
Figure 4B:
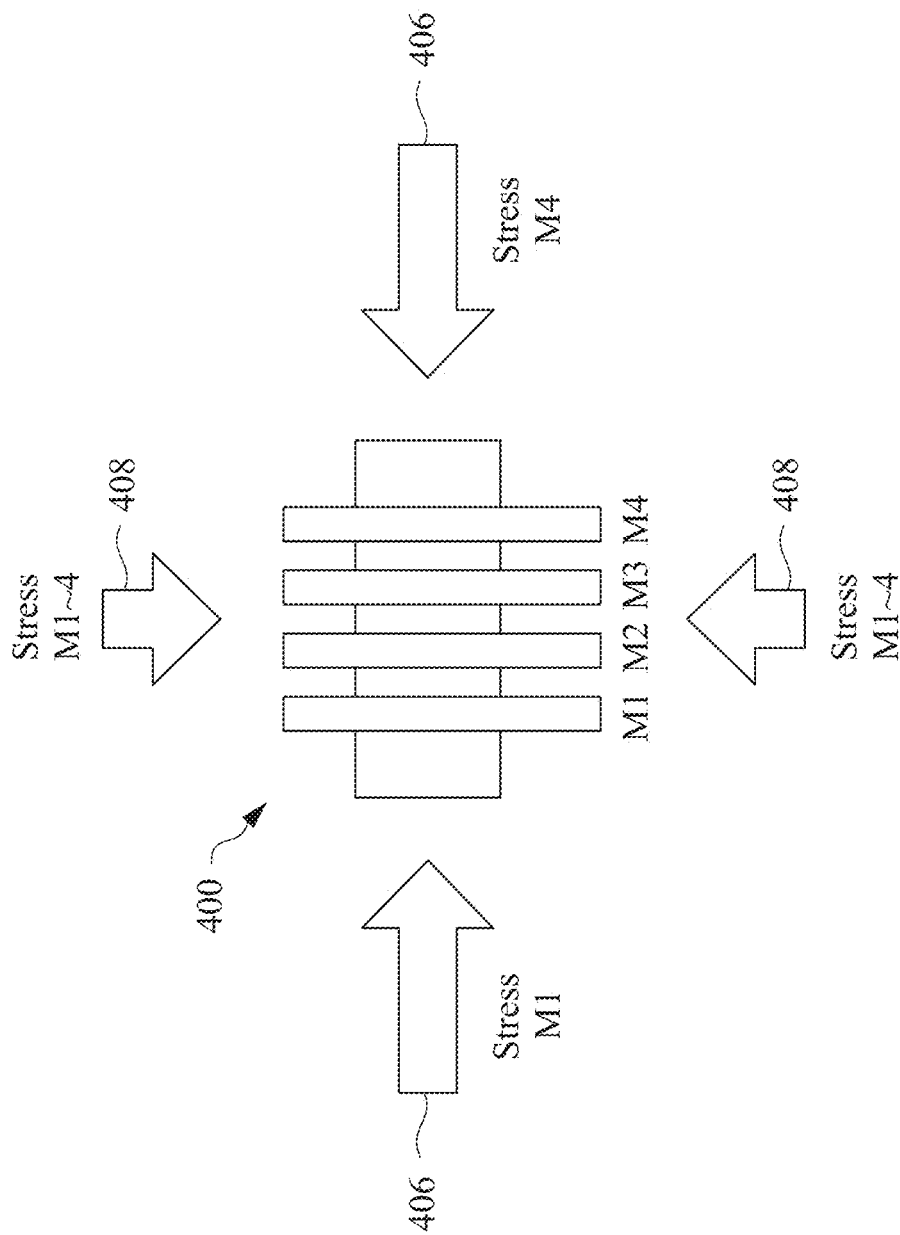

FIGS. 4A and 4B illustrate an example of horizontal and vertical stress caused by a density gradient effect (DGE) in a MOS edge during device fabrication. FIG. 4A illustrates an example MOS array 400 that includes an OD structure 402 and four gate structures 404. As illustrated, the same gate/OD layout 400 may, for example, be utilized to fabricate either a parallel 410 or stacked-gate 412 current mirror. FIG. 4B illustrates an example of the horizontal 406 and vertical 408 stress applied to the MOS array 400 during processing as a result of DGE in the MOS edge. As illustrated, the vertical stress 408 (i.e., the stress acting on the short edges of the gate structures) is uniform to all of the MOS devices (M1-M4) in the array 400, and its effects are therefore averaged between MOS devices (M1-M4). Horizontal stress 406, on the other hand, has a much more substantial effect on the MOS devices (M1 and M4) at the ends of the array 400. As a result, the MOS array 400 suffers more of a DGE effect in the horizontal (x) direction than in the vertical (y) direction. Consequently, a smaller dummy buffer zone may be utilized along the horizontal edges of a MOS array layout, as illustrated in FIG. 5.

Figure 5:
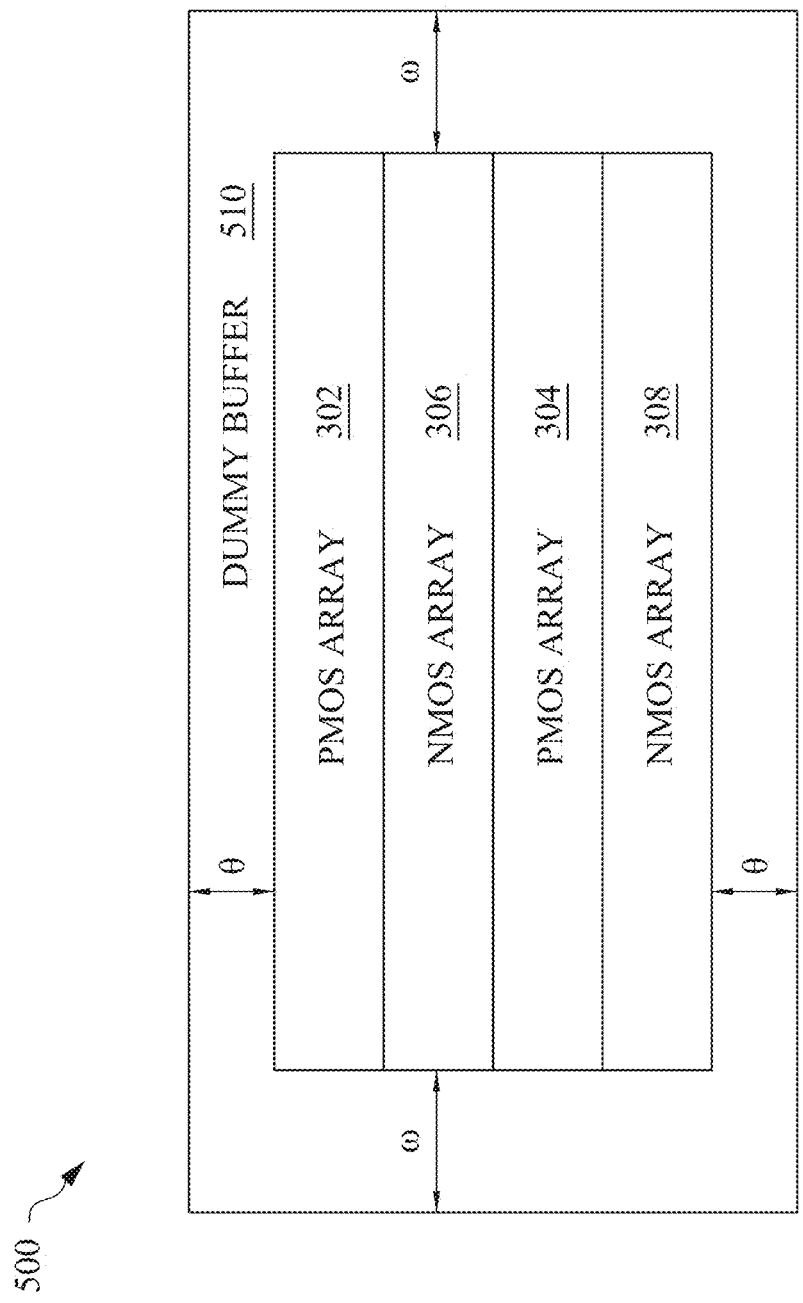
FIG. 5 illustrates another example of a mixed P/N MOS array layout with a uniform gate/OD density, in accordance with some embodiments.

FIG. 5 illustrates another example of a mixed P/N MOS array layout 500 with a uniform gate/OD density. This example layout 500 is similar to the layout 300 shown in FIG. 3 and described above, except that the size of the dummy buffer zone 510 has been reduced along the horizontal edges of the MOS array (i.e., the edges of the MOS array layout that are perpendicular to the gate structures). The reduction in the size of the dummy buffer zone 510 along the horizontal edges of the MOS array is possible because, as explained above, the mixed P/N MOS array layout 500 suffers more of a DGE effect in the horizontal (x) direction than in the vertical (y) direction. The dummy buffer zone 510 thus has a first width ($\omega$) along the vertical edges of the MOS array, and a second, smaller width ($\theta$) along the horizontal edges of the MOS array. The first width ($\omega$) may be sized according to layout guidelines (e.g., 5 µm if the mixed P/N MOS array is smaller than 40×40 µm$^2$, and 20 µm if the mixed P/N MOS array is larger than or equal to 40×40 µm$^2$.) The second width ($\theta$) may be smaller than recommended by the layout guidelines, for example between 0 and 5 µm.

Figure 6:
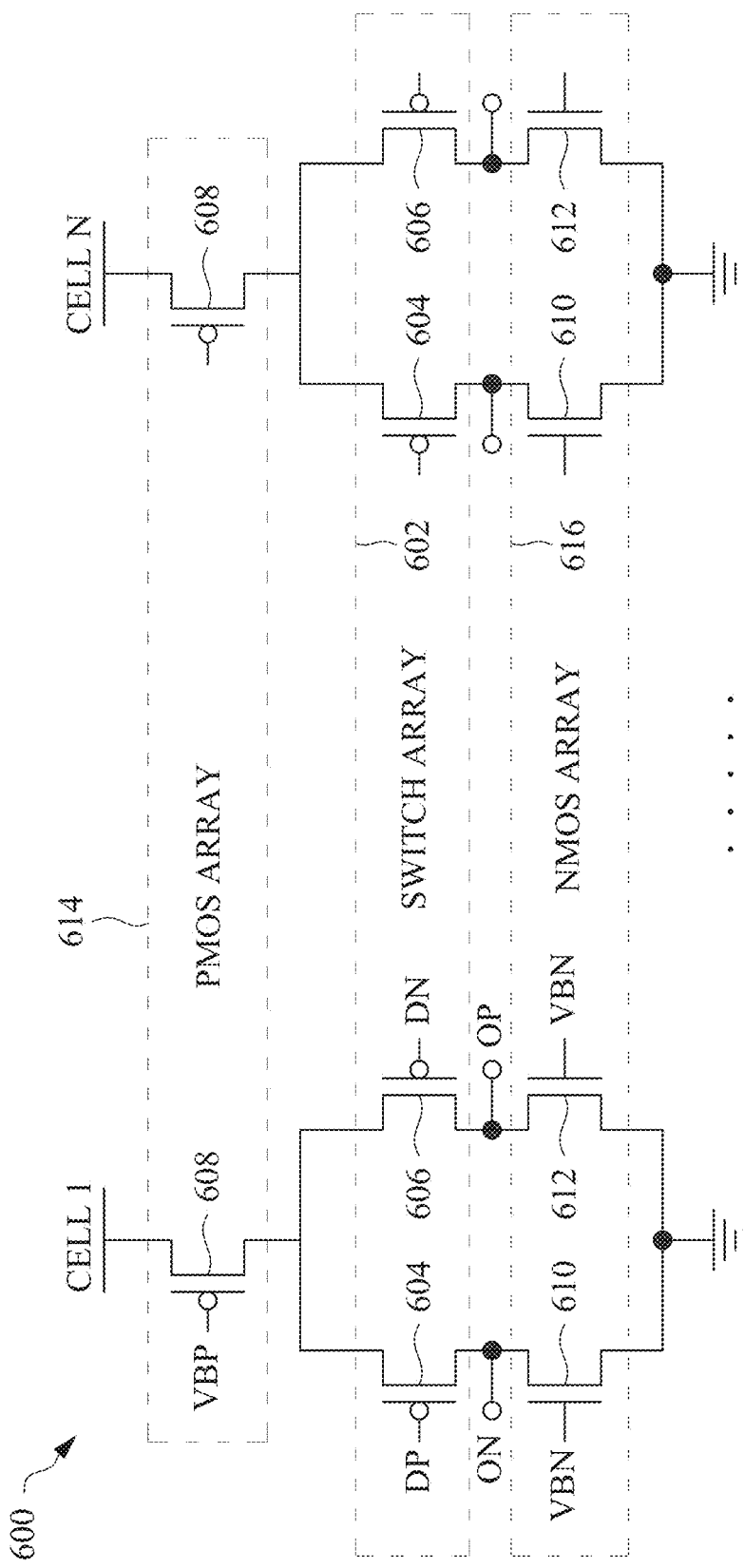

FIGS. 6-12 illustrate an example layout for a digital-to-analog converter circuit utilizing a mixed P/N MOS array layout with a uniform gate/OD density to supply a bias current therefor. FIG. 6 is a circuit diagram of an example digital-to-analog converter (DAC) 600 with a differential current output. The diagrams shown in FIG. 7-12 depict an example mixed P/N MOS array layout for the DAC circuit shown in FIG. 6. It should be understood, however, that similar mixed P/N MOS array layouts and techniques may also be used for other circuit designs.

The DAC circuit 600 shown in FIG. 6 includes a plurality of current cells (Cell 1-Cell N) that generate a differential current output based on a digital input code. The digital input code is applied to a switch array 602 to control the flow of current through the current cells (Cell 1-Cell N.) Within each individual current cell (Cell 1-Cell N), the switch array 602 includes a pair of PMOS transistors 604, 606 that respectively receive a positive (DP) and negative (DN) bit of the digital input code. Each individual current cell (Cell 1-Cell N) further includes a PMOS transistor 608 coupled to a first bias voltage (VBP) and a pair of NMOS transistors 610, 612 each coupled to a second bias voltage (VBN). The biasing PMOS transistors 608 throughout the DAC circuit 600 are fabricated in a PMOS array 614, and the biasing NMOS transistors 610, 612 throughout the DAC circuit 600 are fabricated in an NMOS array 616. In operation, each current cell (Cell-Cell N) in the DAC circuit 600 is turned on (or off) by the digital input code to provide a differential (positive and negative) output (DP and DN.) The digital input code is translated into a corresponding analog current by switching on more or fewer current cells (Cell 1-Cell N) to increase or decrease the total differential current output.

Figure 7A:
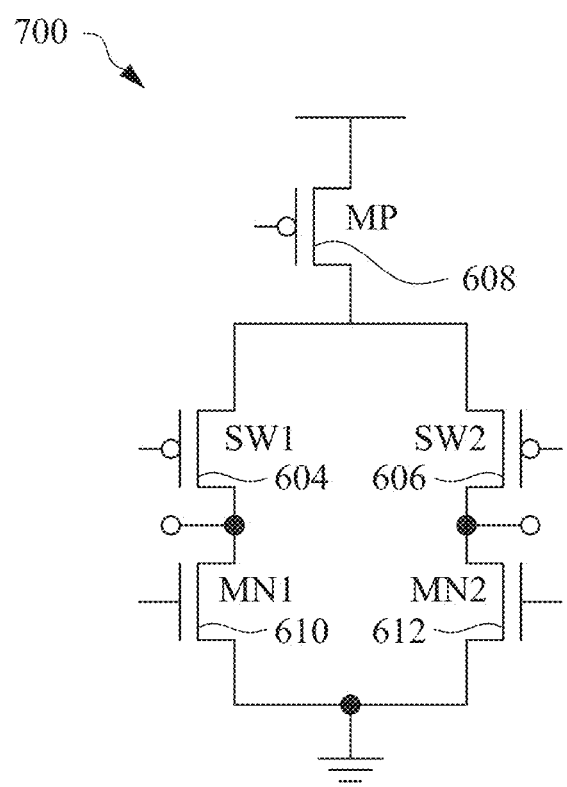
Figure 7B:
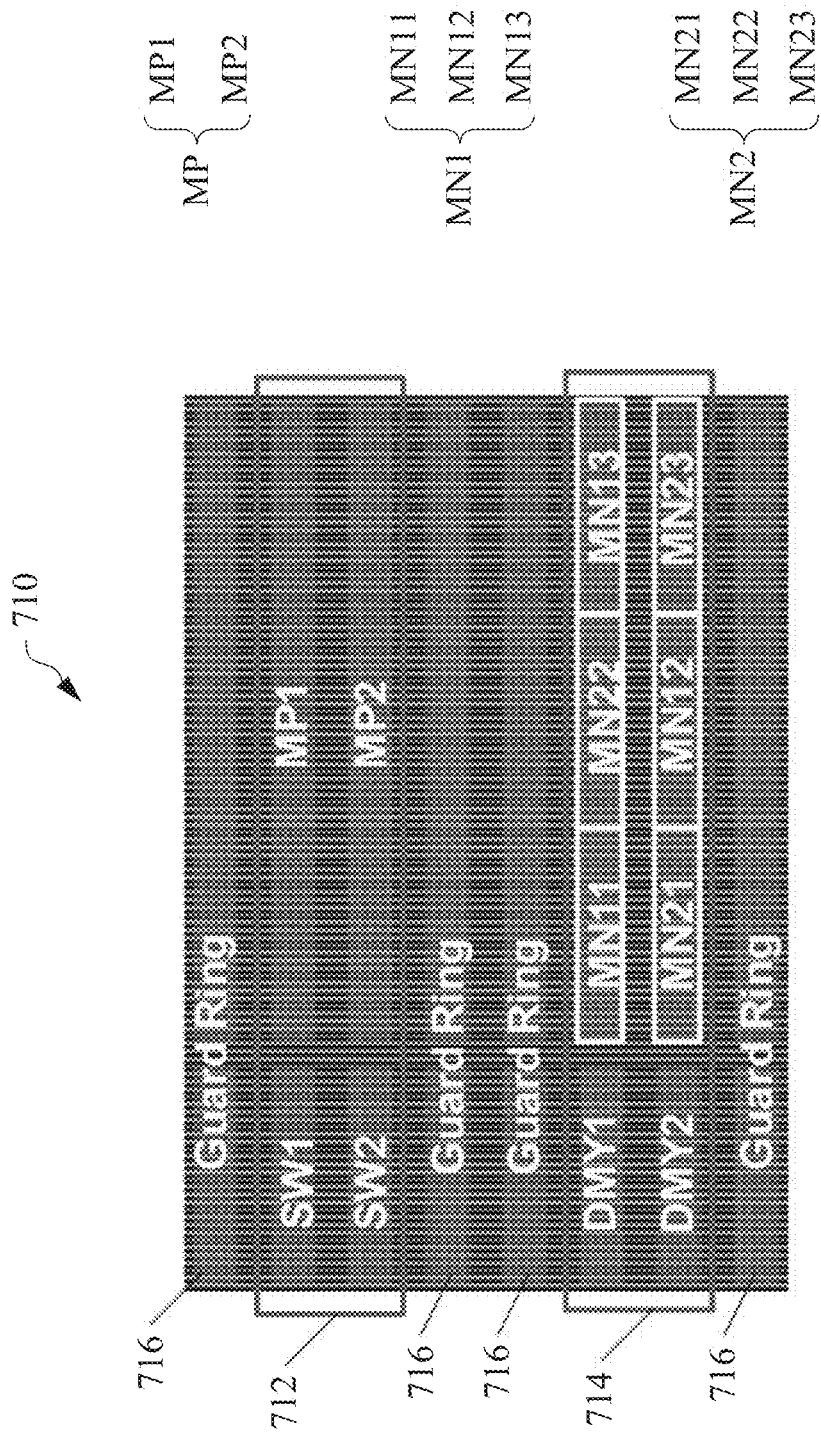

FIG. 7A shows an individual current cell 700 from the DAC circuit 600 of FIG. 6. FIG. 7B illustrates a mixed P/N MOS array layout 710 for the individual current cell 700 shown in FIG. 7A. The current cell layout 710 includes a PMOS array layout area 712 and an NMOS layout array area 714, each of which has a surrounding guard ring (to provide the required MOS body voltage potential.) The PMOS array layout 712 includes PMOS device layouts (MP1, MP2) for the biasing PMOS transistor (MP) 608 and also the PMOS switch transistors (SW1, SW2) 604, 606. The NMOS array layout 714 includes NMOS device layouts (MN11, MN12, MN13) for the biasing NMOS transistor (MN1) 610 and NMOS device layouts (MN21, MN22, MN23) for the biasing NMOS transistor (MN2) 612, and also includes two identical NMOS dummy structures (DMY1, DMY2) that are included to create structural uniformity between the PMOS and NMOS array layouts 712, 714.

The mixed P/N MOS array layout 710 includes a uniform gate/OD density, and therefore does not include dummy buffers between the PMOS and NMOS array layouts 712, 714. The uniform gate density is provided by utilizing a unified gate length and a uniform gate distribution, as further illustrated in FIG. 8. The uniform OD density is provided by utilizing a uniform OD spacing, as described above with reference to FIG. 2C, and also by providing a unified OD size (MOS width) for all devices within the layout 710, as further illustrated in FIG. 9. As shown in FIG. 7B, the uniform OD spacing results in equal OD spacing from NMOS-to-NMOS, PMOS-to-PMOS, NMOS-to-PMOS, NMOS-to guard ring, and PMOS-to-guard ring.

Figure 8:
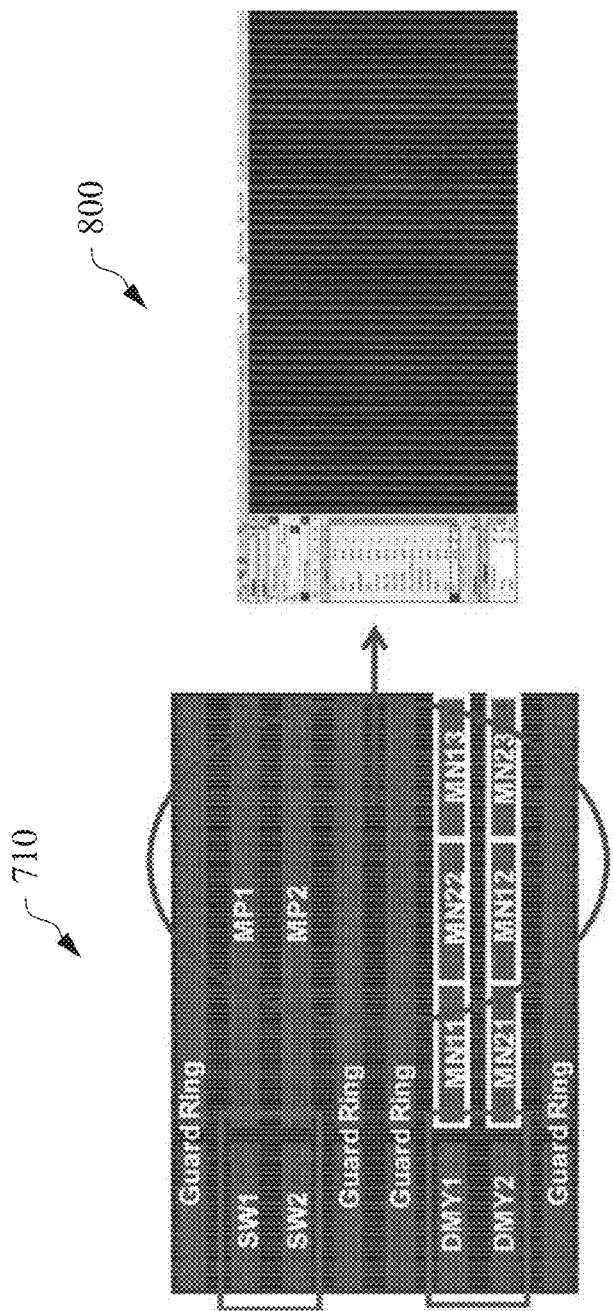

FIG. 8 provides a zoomed in view 800 of the gate layer for the mixed P/N MOS array layout 710. As shown, the gate layer 800 includes a single length gate design with uniformly distributed gate structures, thus providing a uniform gate density for the MOS array layout 710.

FIG. 9A illustrates the OD layer 900 for the mixed P/M MOS array layout 710 of FIG. 7B, showing a uniform OD-to-OD spacing. As shown, the OD layer 900 includes uniformly sized OD structures with uniform spacing ($\gamma$) between OD structures in the vertical direction. In addition, although the layout 710 includes a gap 910 between a first portion 912 of the OD layer 900 that includes the PMOS switch transistors (SW1, SW2) (shown in FIG. 7B) and a second portion 914 of the OD layer 900 that includes the biasing NMOS and PMOS transistors (MP, MN1, MN2) (shown in FIG. 7B), the width of the gap 910 is uniform through the layout 900. FIG. 9B illustrates the OD layer 900 for a larger portion of the DAC circuit 600 (shown in FIG. 6), including multiple individual current cells 700. As shown in FIG. 9B, the uniform gap width 910 is utilized throughout the entire OD layer 900, thus providing uniform OD-to-OD spacing in the horizontal direction. The mixed P/M MOS array layout 710 of FIG. 7B thus includes a uniform OD density in both the horizontal and vertical directions.

Figure 10:
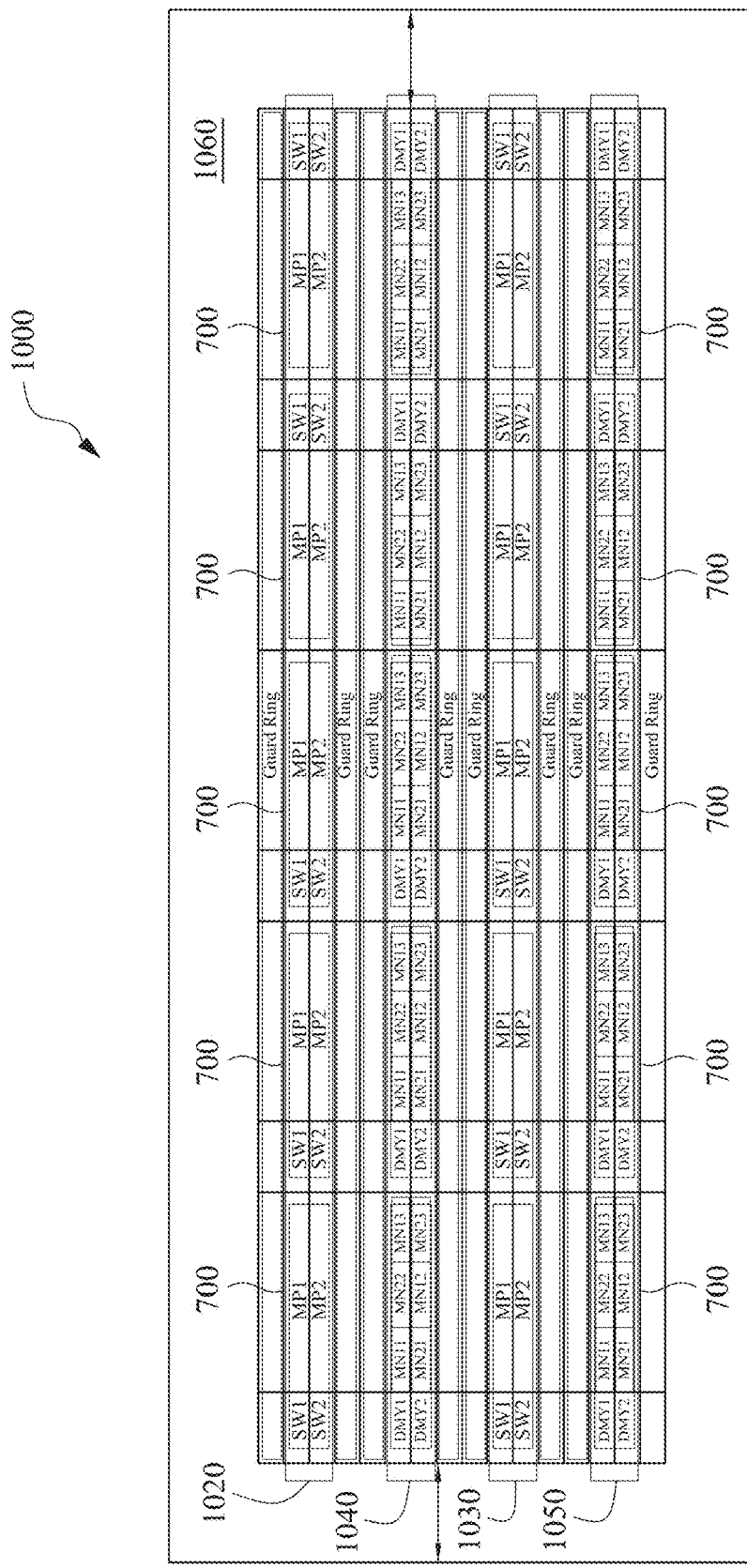

FIG. 10 illustrates a mixed P/N MOS array layout 1000 for the DAC circuit 600 shown in FIG. 6. The layout 1000 includes ten individual current cells 700, the left-most cells 700 of which are each laid out as shown in FIG. 7B and the right-most cells 700 of which are each a mirror image of the individual current cell 700 shown FIG. 7B. Such an arrangement places the PMOS switch transistors (SW1, SW2) and the NMOS dummy structures (DMY1, DMY2) on the outside of the layout 1100, thus further reducing DGE along the array edges. As illustrated, the individual current cells 700 in the mixed P/N MOS array layout 1000 are arranged in two rows, thus forming a PMOS array 1020, 1030 and an NMOS array 1040, 1050 in each of the two rows of the layout 1000.

The mixed P/N MOS array layout 1000 further includes a surrounding dummy buffer zone 1060, described in more detail below with reference to FIG. 12. Because of the uniform gate/OD density throughout the layout 1000, as explained above, the mixed P/N MOS array layout 1000 does not require dummy buffers between the PMOS and NMOS arrays, 1020, 1030, 1040, 1050.

Figure 11:
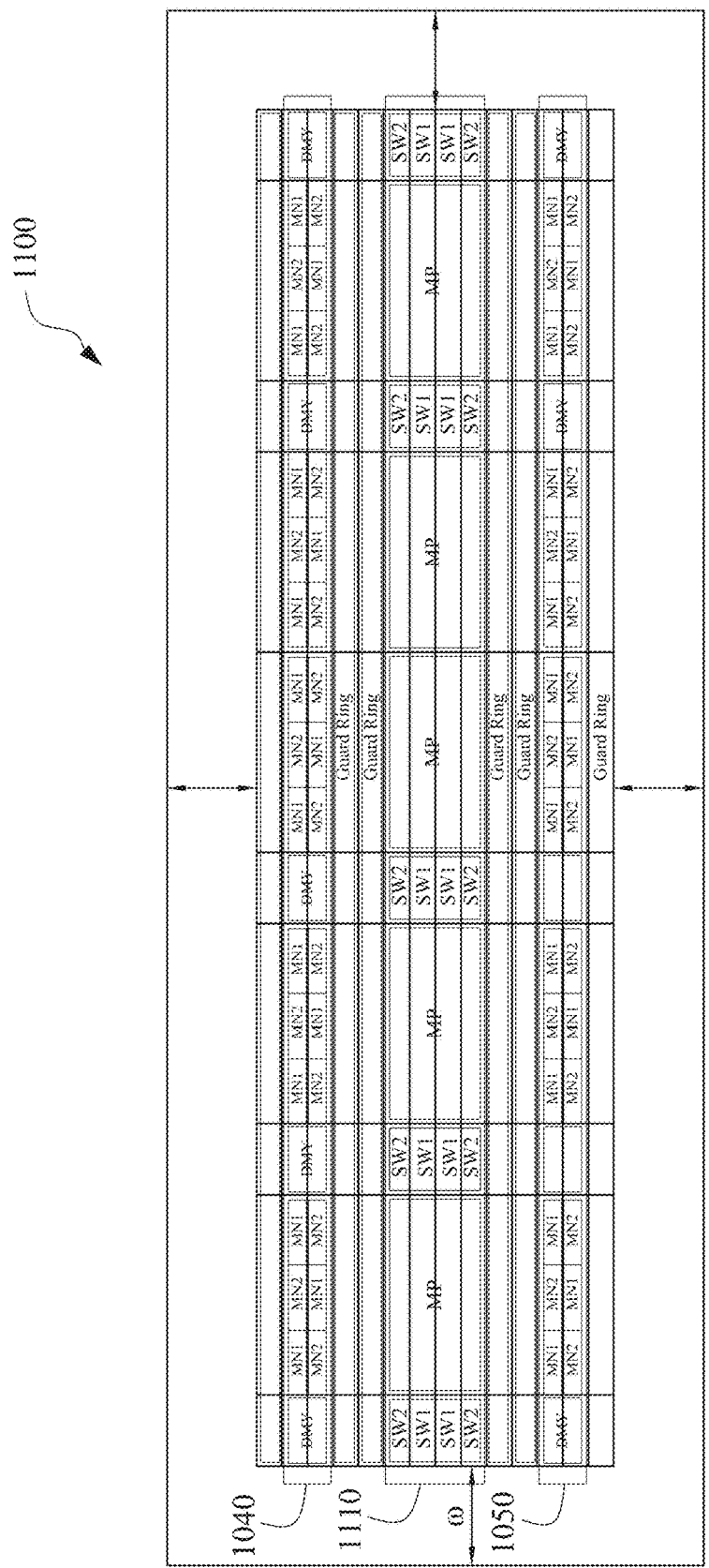

FIG. 11 illustrates a mixed P/N MOS array layout 1100 for the DAC circuit 600 shown in FIG. 6, according to another embodiment. In this embodiment, the PMOS array in the top row is repositioned to be in the center of the layout 1100 alongside the bottom row PMOS array, forming a merged PMOS array 1110. This revised layout 1100 allows for the elimination of one guard ring width in the PMOS array 1110, thus further reducing the overall layout area. In addition, the shuffled layouts (MN11, MN12, MN13, MN21, MN22, MN23) for the NMOS transistors (MN1, MN2) provides for a better matched layout than the PMOS transistors (MP)(see FIG. 7B). Thus, placing the better matched NMOS arrays 1040, 1050 on the outside of the layout 1100 further reduces DGE along the array edges.

Figure 12:
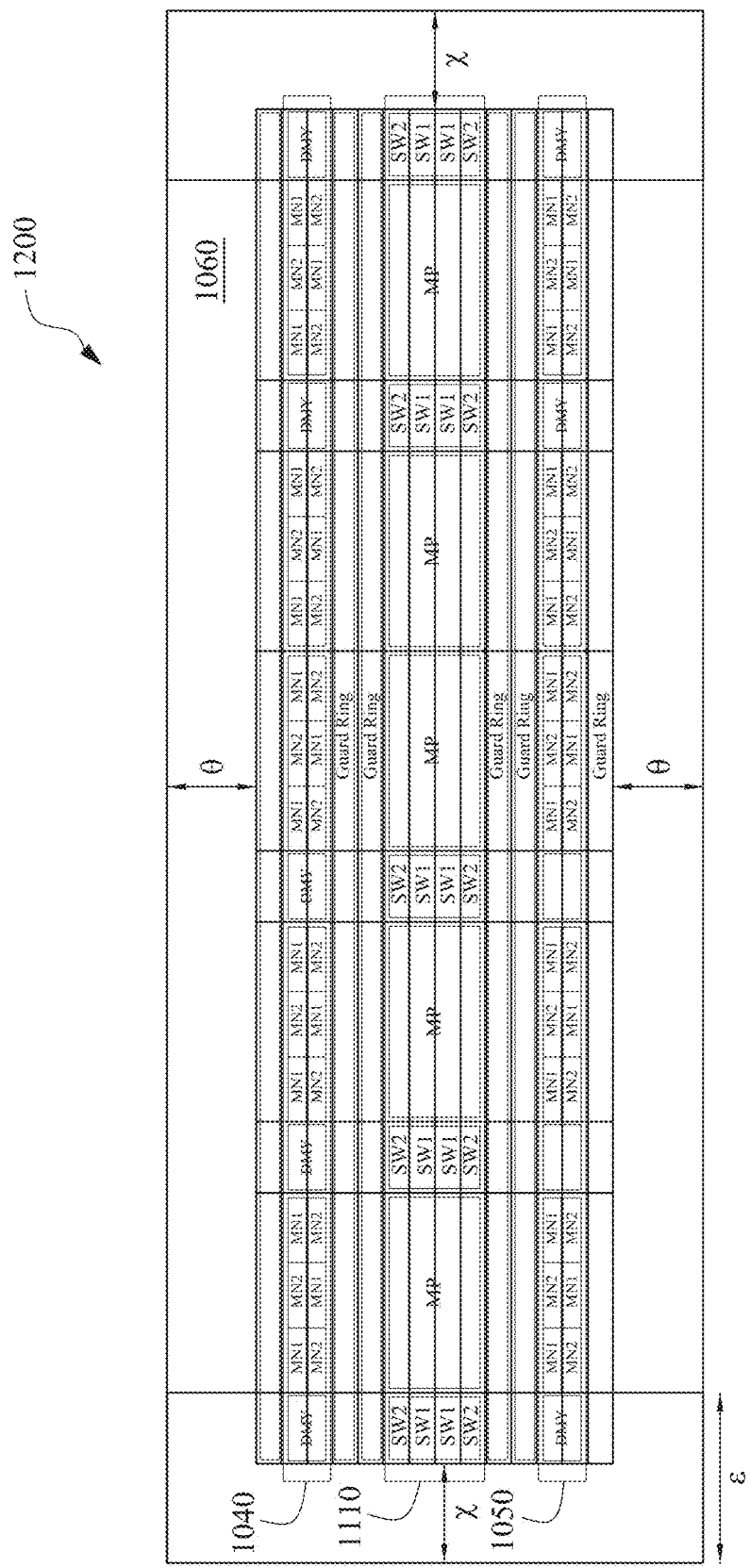

FIG. 12 illustrates the reduction in dummy buffer zone 1060 area that is provided by the illustrated mixed P/N MOS array layout 1200. As detailed above, the mixed P/N MOS array layout 1200 does not require dummy buffers between different MOS types because of its uniform gate/OD density. In addition, the dummy buffer zone 1060 surrounding the mixed P/N MOS array layout 1200 has a horizontal width ($\theta$) and a vertical width ($\chi$) that are smaller than recommended by layout guidelines.

As explained above with reference to FIGS. 4A, 4B and 5, the dummy buffer zone 1060 may be smaller than recommended guidelines along the horizontal edges of the layout 1060 because the mixed P/N MOS array layout 1200 suffers more of a DGE effect in the horizontal (x) direction than in the vertical (y) direction. The horizontal width ($\theta$) of the dummy buffer zone 1060 is therefore smaller than the recommended width (e.g., 20 μm), for example between 0 and 5 μm.

In addition, the isolation of the PMOS switch transistors (SW1, SW2) along the vertical edges of the mixed P/N MOS array layout 1100 (i.e., there are no MP, MN1 or MN2 transistors along the vertical edges) enables the vertical width ($\chi$) of the dummy buffer zone 1060 to also be reduced below the width (e.g., 20 μm) recommended by the layout guidelines. The performance of the PMOS switch transistors (SW1, SW2) does not affect the accuracy of the mixed P/N MOS array layout 1200. The PMOS switch transistors (SW1, SW2) may therefore be treated as a buffer zone for the purpose of MOS layout. The effective width ($\epsilon$) of the buffer zone along the vertical edges of the mixed P/N MOS array layout 1200 is therefore the combination of the vertical width ($\chi$) of the dummy buffer zone 1060 and the width of the PMOS switch transistors (SW1, SW2). Because the mixed P/N MOS array layout 1200 suffers a greater DGE effect in the horizontal (x) direction, as explained above, the effective width ($\epsilon$) of the vertical buffer zone should meet the recommended layout guidelines (e.g., 5 μm if the mixed P/N MOS array is smaller than 40×40 μm$^2$, and 20 μm if the mixed P/N MOS array is larger than or equal to 40×40 μm$^2$.)

Figure 13:
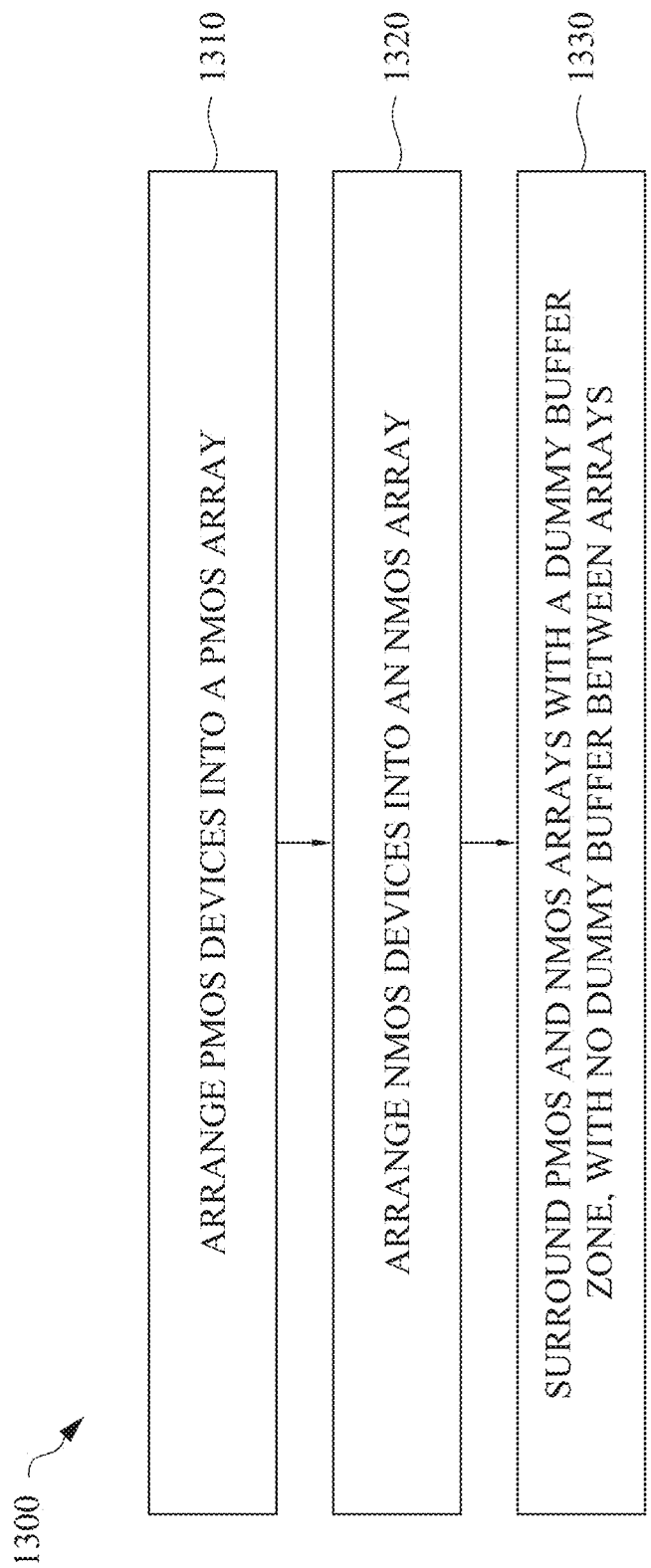
FIG. 13 is a flow diagram of an example method for fabricating a mixed P/N MOS array, in accordance with some embodiments.

FIG. 13 is a flow diagram of an example method 1300 for fabricating a mixed P/N MOS array. The method 1300 can be performed using a variety of structures. For ease of understanding, the following steps are described with structure of FIG. 5. At step 1310, a plurality of PMOS devices 302, 304 are arranged into a PMOS array. At step 1320, a plurality of NMOS 306, 308 devices are arranged into an NMOS array. A dummy buffer zone 510 is arranged to surround the PMOS and NMOS arrays at step 1330. The PMOS and NMOS arrays 302-308 are arranged to have uniform spacing between the plurality of PMOS devices, between the plurality of NMOS devices, and between the PMOS and NMOS array. In addition, further MOS pattern uniformity may be provided by providing PMOS and NMOS devices that are uniform in size and by providing silicon gate structures for the PMOS and NMOS devices that have a uniform length and that are uniformly distributed throughout the PMOS and NMOS arrays 302-308. Because of the resultant MOS pattern uniformity, the mixed P/N MOS array does not include a dummy buffer zone between the PMOS and NMOS arrays.

In one embodiment of the disclosure, a semiconductor structure includes a p-channel metal-oxide semiconductor (PMOS) array having a first set of oxide diffusion layer (OD) structures, an n-channel metal-oxide semiconductor (NMOS) array having a second set of OD structures, and a dummy buffer zone surrounding the PMOS and NMOS arrays. The semiconductor structure has a uniform spacing between OD structures in the first and second sets of OD structures and between the PMOS and NMOS array, such that no dummy buffer zone is included between the PMOS array and the NMOS array.

In one embodiment of the disclosure, a method of fabricating a semiconductor device array includes: arranging a plurality of p-channel metal-oxide semiconductor (PMOS) devices into a PMOS array; arranging a plurality of n-channel metal-oxide semiconductor (NMOS) devices into an NMOS array; and arranging a dummy buffer zone to surround the PMOS and NMOS arrays. The semiconductor device array has uniform spacing between the plurality of PMOS devices, between the plurality of NMOS devices, and between the PMOS and NMOS array, such that no dummy buffer zone is included between the PMOS array and the NMOS array.

In one embodiment of the disclosure, a semiconductor device includes a device circuit and a biasing circuit configured to supply a bias current to the device circuit. The biasing circuit includes a first metal-oxide semiconductor (MOS) transistor that has a first conductivity type and that includes first and second oxide diffusion (OD) structures, and a second MOS transistor that has a second conductivity type and that includes a third OD structure, wherein the first, second, and third OD structures are aligned along a first direction and have a uniform OD spacing.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure comprising:
   a p-channel metal-oxide semiconductor (PMOS) array having a first set of oxide diffusion layer (OD) structures;
   an n-channel metal-oxide semiconductor (NMOS) array having a second set of OD structures; and
   a dummy buffer zone surrounding the PMOS and NMOS arrays;
   wherein the semiconductor structure has a uniform spacing between OD structures in the first and second sets of OD structures and between the PMOS and NMOS array, such that no dummy buffer zone is included between the PMOS array and the NMOS array.

2. The semiconductor structure of claim 1, wherein each OD structure in the first and second sets of OD structures has a uniform size.

3. The semiconductor structure of claim 1, wherein the PMOS and NMOS arrays include gate structures having a uniform length.

4. The semiconductor structure of claim 1, wherein the PMOS and NMOS arrays include gate structures, and the gate structures are uniformly distributed throughout the PMOS and NMOS arrays.

5. The semiconductor structure of claim 1, wherein the dummy buffer zone includes physical layout topologies that are identical to physical layout topologies of at least one of the PMOS array and the NMOS array, but are not electrically active.

6. The semiconductor structure of claim 1, wherein the PMOS and NMOS arrays include gate structures, and wherein the dummy buffer zone is smaller along edges of the PMOS array or NMOS array that are perpendicular to the gate structures.

7. A method of fabricating a semiconductor device array, comprising:
   arranging a plurality of p-channel metal-oxide semiconductor (PMOS) devices into a PMOS array;
   arranging a plurality of n-channel metal-oxide semiconductor (NMOS) devices into an NMOS array;
   arranging a dummy buffer zone to surround the PMOS and NMOS arrays;
   wherein the semiconductor device array has uniform spacing between the plurality of PMOS devices, between the plurality of NMOS devices, and between the PMOS and NMOS array, such that no dummy buffer zone is included between the PMOS array and the NMOS array.

8. The method of fabricating a semiconductor device array of claim 7, wherein the PMOS devices are uniform in size.

9. The method of fabricating a semiconductor device array of claim 7, wherein the NMOS devices are uniform in size.

10. The method of fabricating a semiconductor device array of claim 7, wherein the PMOS and NMOS devices are all uniform in size.

11. The method of fabricating a semiconductor device array of claim 7, wherein the PMOS and NMOS devices include gate structures having a uniform length.

12. The method of fabricating a semiconductor device array of claim 7, wherein the PMOS and NMOS devices include gate structures, and the gate structures are uniformly distributed throughout the PMOS and NMOS arrays.

13. The method of fabricating a semiconductor device array of claim 7, wherein the dummy buffer zone includes physical layout topologies that are identical to physical layout topologies of at least one of the PMOS array and the NMOS array, but are not electrically active.

14. The method of fabricating a semiconductor device array of claim 7, wherein the PMOS and NMOS devices include gate structures, and wherein the dummy buffer zone is smaller along edges of the PMOS array or NMOS array that are perpendicular to the gate structures.

15. A semiconductor device comprising:
   a device circuit; and
   a biasing circuit configured to supply a bias current to the device circuit, the biasing circuit including
      a first metal-oxide semiconductor (MOS) transistor that has a first conductivity type and that includes first and second oxide diffusion (OD) structures, and
      a second MOS transistor that has a second conductivity type and that includes a third OD structure, wherein the first, second, and third OD structures are aligned along a first direction and have a uniform OD spacing.

16. The semiconductor device of claim 15, wherein the device circuit includes a fourth MOS transistor that has a fourth OD structure aligned with one of the first, second, and third OD structures along a second direction transverse to the first direction.

17. The semiconductor device of claim 16, further comprising a buffer zone surrounding the biasing circuit and having an effective width that is the combination of a width thereof and a width of the fourth MOS transistor.

18. The semiconductor device of claim 15, wherein the first, second, and third OD structures have a uniform size.

19. The semiconductor device of claim 15, wherein the first and second MOS transistors further includes gate structures that have a uniform size.

20. The semiconductor device of claim 15, wherein the first and second MOS transistors further includes gate structures that have a uniform pitch.

* * * * *